(12) United States Patent
Aikawa et al.

(10) Patent No.: US 6,771,137 B2
(45) Date of Patent: Aug. 3, 2004

(54) HIGH-FREQUENCY OSCILLATOR

(75) Inventors: Masayoshi Aikawa, Kanagawa (JP); Takayuki Tanaka, Saga (JP); Fumio Asamura, Saitama (JP); Kenji Kawahata, Saitama (JP); Takeo Oita, Saitama (JP)

(73) Assignee: Nihon Dempa Kogyo Co. Ltd, Tokyo (JP)

( * ) Notice: Subject to any disclaimer, the term of this patent is extended or adjusted under 35 U.S.C. 154(b) by 0 days.

(21) Appl. No.: 10/305,856

(22) Filed: Nov. 27, 2002

(65) Prior Publication Data

US 2003/0102927 A1 Jun. 5, 2003

(30) Foreign Application Priority Data

Nov. 30, 2001 (JP) ........................................ 2001-367474

(51) Int. Cl.⁷ ................................................. H03B 5/18
(52) U.S. Cl. ............................ 331/99; 331/56; 331/96; 331/117 D
(58) Field of Search .............................. 331/46, 56, 96, 331/99, 117 R, 117 FE, 117 D, 107 DP, 107 P, 107 SL

(56) References Cited

U.S. PATENT DOCUMENTS 4,619,001 A * 10/1986 Kane ........................ 455/192.3

* cited by examiner

Primary Examiner—David Mis
(74) Attorney, Agent, or Firm—Katten Muchin Zavis Rosenman

(57) ABSTRACT

A high-frequency oscillator includes: a substrate composed of a dielectric material; a first transmission line of coplanar structure which is arranged on one principal surface of the substrate; an amplifier having an input terminal and an output terminal and which is inserted into the first transmission line such that the input terminal and output terminal connect to the first transmission line; and a second transmission line which is provided on the other principal surface of the substrate, which electromagnetically couples with the first transmission line, and which constitutes a feedback circuit with respect to the amplifier. The first transmission line is typically a coplanar line of finite length, and the second transmission line is typically a microstrip line.

18 Claims, 9 Drawing Sheets

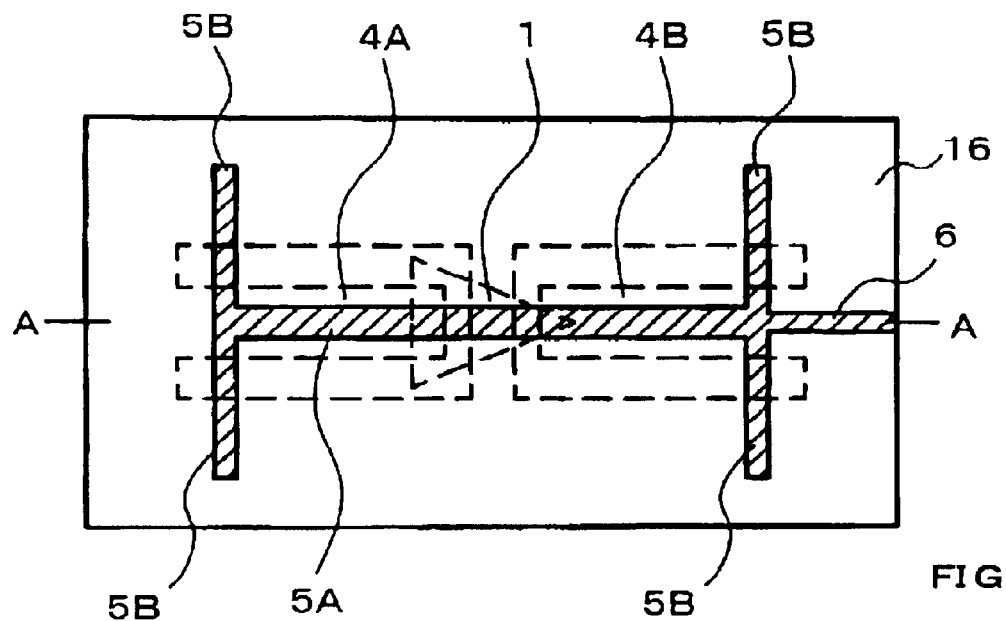
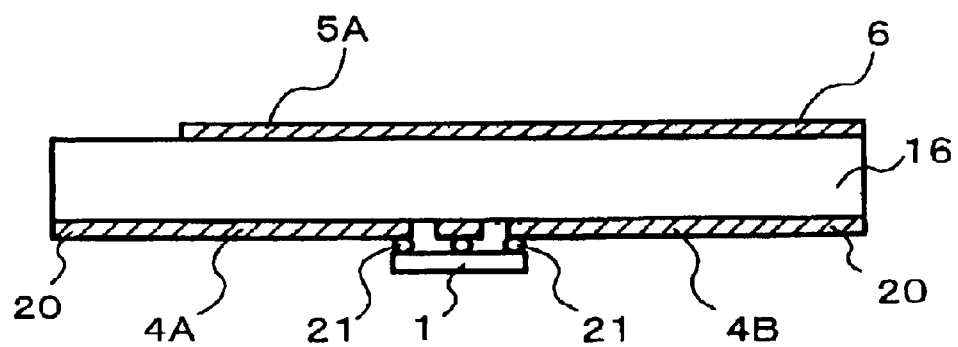
FIG. 3A
FIG. 3B

HIGH-FREQUENCY OSCILLATOR

BACKGROUND OF THE INVENTION

1. Field of the Invention

The present invention relates to a high-frequency oscillator of the microwave band or millimeter wave band, and more particularly to a high-frequency oscillator in which a high-frequency amplification device or IC (integrated circuit) chip having an amplification capability, a coplanar line of finite length, and a microstrip line are formed on both sides of a substrate.

2. Description of the Related Art

In high-frequency apparatuses or high-speed apparatuses, oscillators of the microwave band or millimeter band are extremely important functional circuits in terms of both performance and cost. In particular, when the oscillation frequency reaches high frequencies of the millimeter band, a high-output, high-quality, and low-cost oscillator has been difficult to realize due to the constraints of the high-frequency characteristics of active devices and the increase in loss in the circuit.

FIG. 1 shows one example of the configuration of a high-frequency oscillator of the prior art. In this oscillator, amplifier circuit 1 constituted by, for example, an MMIC (Microwave Monolithic Integrated Circuit) is provided on substrate 16 which is composed of, for example, a dielectric material; and feedback circuit 3 including power distribution circuit 2 is connected to the input end of amplifier circuit 17. Feedback circuit 3 is constituted as a microstrip line circuit on substrate 16. In addition, power distribution circuit 2 is electromagnetically coupled with output microstrip line 17 which is connected to the output end of amplifier circuit 1.

However, when the feedback-type circuit is constituted by a microstrip line circuit as shown in FIG. 1 and used in a high-frequency oscillator, a via-hole must be provided on the substrate for grounding the amplification circuit, and this configuration produces an inductance component which is a cause of degradation of the high-frequency characteristic of the oscillator. Further, a complicated design is required when an advanced oscillation function is to be realized, such as when injecting a frequency component which is an integral submultiple of the oscillation frequency to stabilize the oscillation frequency, i.e., when performing subharmonic injection locking; or when combining the outputs of oscillators having the same oscillation frequency to attenuate the fundamental frequency component and output only a secondary harmonic component, i.e., when implementing the so-called "push—push" function. The realization of these functions using the prior art configuration of an oscillator generally entailed a complex construction. Problems were encountered regarding, in particular, complexity in the design of the feedback circuit as well as the large circuit scale and size. In ultrahigh frequency bands such as the millimeter band and sub-millimeter band in particular, the design was not only complicated but also tended to be extremely difficult to fabricate.

SUMMARY OF THE INVENTION

It is an object of the present invention to provide a high-frequency oscillator which is suitable for oscillating from the microwave band to the millimeter and sub-millimeter bands, which has a simple construction, which facilitates higher oscillator output, and which easily realizes various functions with high quality.

In order to realize the above-described objects, we have succeeded in inventing a feedback-type high-frequency oscillator which has a simple constitution and which is based on a biplanar circuit technology in which a plurality of types of microwave lines are arranged on both surfaces of a substrate composed of, for example, a dielectric material.

In other words, the object of the present invention is achieved by a high-frequency oscillator which includes: a substrate; a first transmission line having a coplanar structure which is arranged on one principal surface of the substrate; an amplifier which has an input terminal and output terminal and which is inserted into the first transmission line such that the input terminal and output terminal connect to the first transmission line; and a second transmission line which is provided on the other principal surface of the substrate for electromagnetically coupling with the first transmission line and which feedback circuit with respect to the amplifier.

In the present invention, a component that is composed of, for example, a dielectric or a semiconductor may be used as the substrate. On one principal surface of the substrate, a construction such as a coplanar line or a coplanar waveguide is formed as a transmission line of coplanar structure, and on this transmission line an amplifier module or an IC (Integrated Circuit) chip having an amplifying capability is mounted as the amplifier. On the other principal surface of the substrate, a second transmission line is provided that electromagnetically couples with the transmission line that has been formed on the one principal surface of the substrate, and this second transmission line functions as a feedback circuit of the amplifier. A component of, for example, microstrip line structure may be employed as the second transmission line.

A high-frequency oscillator of this type has an amplifying device loaded on a transmission line of coplanar structure such as, for example, a coplanar line, and as a result, has the advantages of enabling easy application of flip-chip mounting by means of a surface mounting technique or a bump technique, and moreover, providing high mounting accuracy. Further, the parasitic reactance component that accompanies the amplifying device can be reduced. As a result, the previously described problems of the prior art can be greatly mitigated even when generating frequency signals of the millimeter band or sub-millimeter band, and the greater simplification, higher output, higher frequency, and moreover, high-quality characteristics of a high-frequency oscillator can thus be realized.

In addition, the high-frequency oscillator of the present invention can facilitate both the mounting of a variable-reactance element for variable control of the oscillation frequency and the injection of a subharmonic locking signal. Further, combining high-frequency oscillators of the present invention enables easy construction of a push—push oscillator which generates a signal having a frequency of two times or four times the fundamental oscillation frequency.

The superior advantages of the above-described invention are the result of effectively utilizing the effects of biplanar circuit technology for constituting planar circuits on the surface of the substrate.

Further, through the application of three-dimensional monolithic microwave integrated circuit technology, the high-frequency oscillator of the present invention can be constituted as a monolithic circuit and therefore can be extremely effective in lowering the cost of a millimeter band oscillator.

BRIEF DESCRIPTION OF THE DRAWINGS

FIG. 3A is a plan view showing the high-frequency oscillator according to a second embodiment of the present invention.

FIG. 3B is a sectional view taken along line A—A of FIG. 3A.

DETAILED DESCRIPTION OF THE INVENTION

Figure 1:
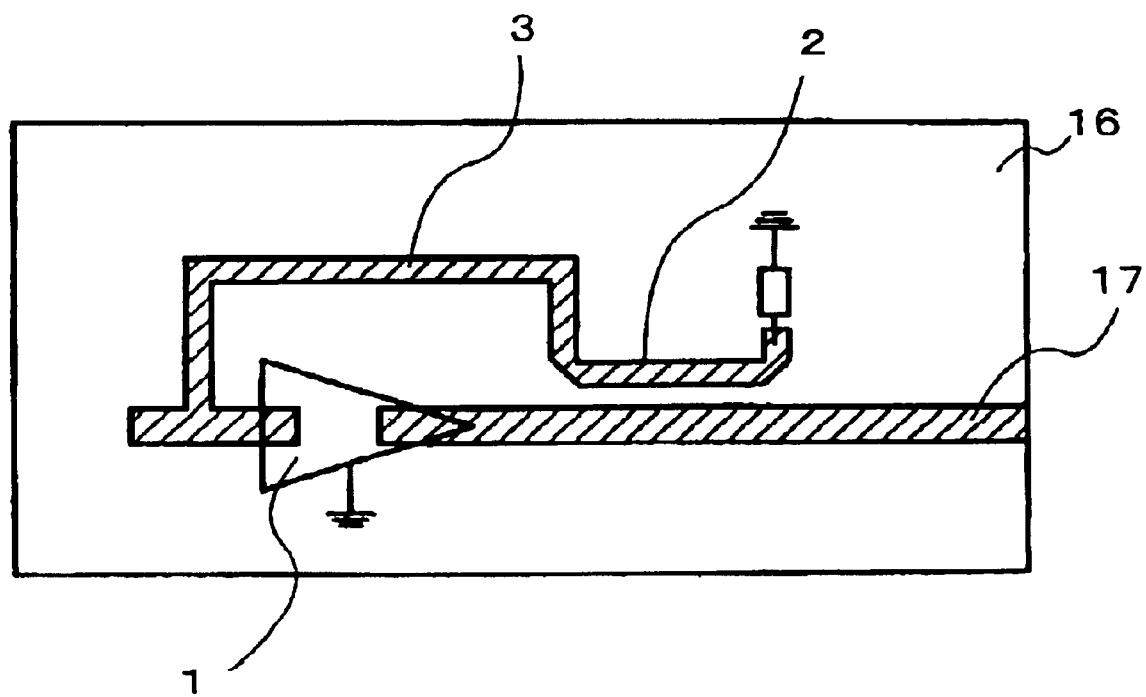
FIG. 1 is a plan view showing one example of the construction of a high-frequency oscillator of the prior art.
Figure 2A:
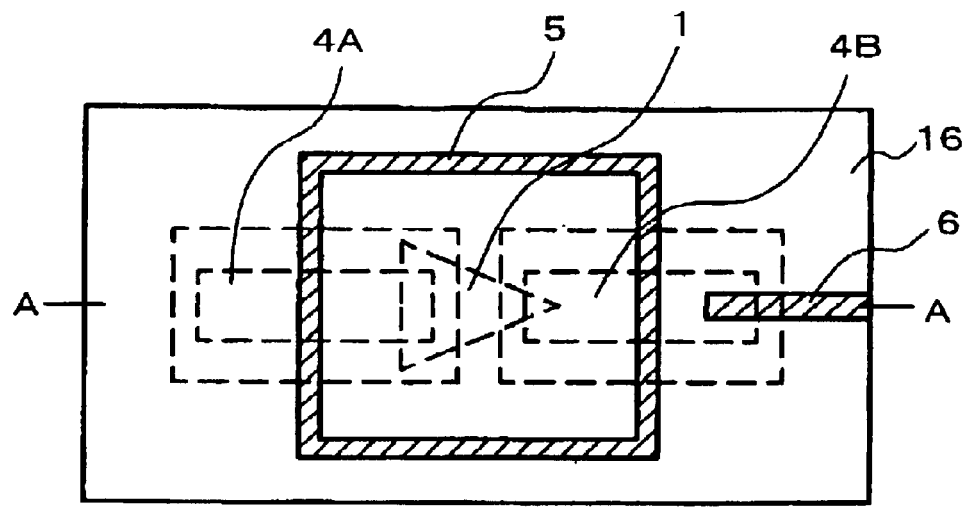
FIG. 2A is a plan view showing a high-frequency oscillator according to a first embodiment of the present invention.
Figure 2B:
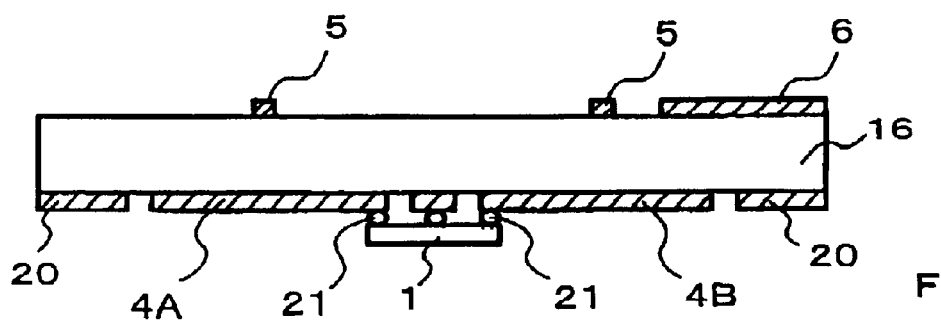
FIG. 2B is a sectional view taken along line A—A of FIG. 2A.

The high-frequency oscillator according to the first embodiment of the present invention shown in FIGS. 2A and 2B includes feedback circuit 5 constituted as a microstrip line of loop form on a first principal surface of substrate 16 which is composed of, for example, a dielectric. In the oscillator shown in the figure, feedback circuit 5 is formed on the first principal surface as a circuit conductor having a fixed width and aligned approximately along the sides of a rectangle.

Ground conductor 20 is provided over substantially the entire surface of the second principal surface of substrate 16. In addition, two strip-shaped openings are provided in ground conductor 20, and in each opening, a signal line that extends in the longitudinal direction of the opening is formed as a circuit conductor. The signals lines in both openings together with surrounding ground conductor 20 form coplanar line portions 4A and 4B, respectively. The circuit conductor which constitutes feedback circuit S is provided on the first principal surface so as to transversely cross both of coplanar line portions 4A and 4B, whereby each of coplanar line portions 4A and 4B and feedback circuit 5 are electromagnetically coupled with each other via substrate 16 interposed.

Amplifying device 1 constituted by, for example, an MMIC is provided on the second principal surface of substrate 16 so as to straddle the two coplanar line portions 4A and 4B, the input terminal of amplifying device 1 connecting to the right end of one coplanar line portion 4A by way of bumps 21 and the output terminal of amplifying device 1 connecting to the left end of the other coplanar line portion 4B by way of bumps 21. The ground terminal of amplifying device 1 connects to ground conductor 20 by way of bump 21 at a position midway between the two coplanar line portions 4A and 4B. The entirety of coplanar line portions 4A and 4B constitutes one coplanar line, and amplifying device 1 is provided such that it is inserted substantially midway in this coplanar line.

Further, output port 6 of the microstrip line structure is formed on the first principal surface of substrate 16 to correspond to the position of the right end of coplanar line portion 4B on the output side and electromagnetically couples with this coplanar line portion 4B.

In an oscillator which is constructed as described in the foregoing description, characteristics such as oscillation frequency are determined by the electrical characteristics of amplifying device 1 and the conditions in which positive feedback is established by the coplanar line of finite length which is made up by coplanar line portions 4A and 4B and feedback circuit S which electromagnetically couples with this coplanar line. The oscillation output is extracted by way of output port 6.

The present embodiment thus enables the constitution of a high-frequency oscillator of from the microwave band to the millimeter band by means of an extremely simple structure.

Referring now to FIGS. 3A and 3B, the high-frequency oscillator according to the second embodiment of the present invention is next described. This oscillator is similar to the oscillator of the first embodiment but differs in that the feedback circuit formed on the first principal surface of substrate 16 is constituted by microstrip lines of linear shape and in that the coplanar line composed of coplanar line portions 4A and 4B provided on the second principal surface is of a two-ended short-circuit structure. In other words, the left end of the signal line at coplanar line portion 4A on the input side of amplifying device 1 and the right end of the signal line at coplanar line portion 4B on the output side are each simply connected to ground conductor 20.

Feedback circuit 5A, which has a microstrip line structure and a linear shape, is provided on the first principal surface so as to overlie the signal lines of the coplanar line. In the oscillator shown in the figure, this feedback circuit 5A is directly coupled with output port 6 for extracting the oscillation output. Further, resonant lines 5B of microstrip line structure for providing feedback circuit 5A with a frequency selection characteristic are provided on the first principal surface at both ends of feedback circuit 5A so as to extend in a direction that is orthogonal to the direction in which feedback circuit 5A extends.

Although the above-described first and second embodiments both employ a feedback circuit of loop form or linear form and a linear output port, other forms or structures may also be used for the feedback circuit and output port. In particular, a ground conductor may be provided on the first principal surface of substrate 16, and the feedback circuit and output port may be constituted as coplanar lines.

Figure 4A:
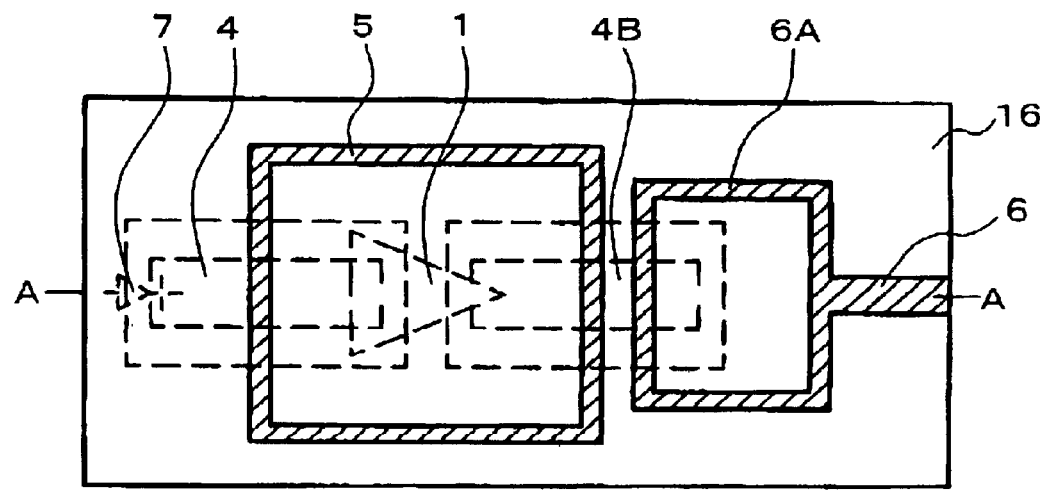
FIG. 4A is a plan view showing the high-frequency oscillator according to a third embodiment of the present invention.
Figure 4B:
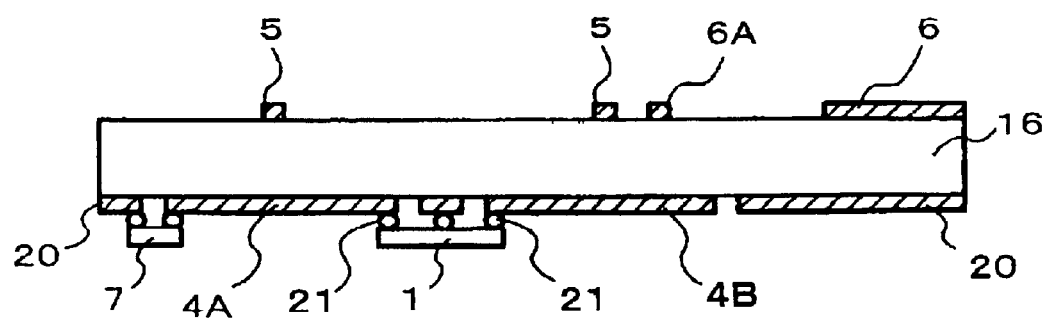
FIG. 4B is a sectional view taken along line A—A of FIG. 4A.

Referring now to FIGS. 4A and 4B, the high-frequency oscillator according to the third embodiment of the present invention is next described. The oscillator of the third embodiment is constituted as a voltage-controlled oscillator in which the oscillator of the first embodiment has a variable frequency capability.

In other words, the oscillator of the third embodiment is an oscillator in which variable-reactance element 7 is connected to the coplanar line in the oscillator of the first embodiment. More specifically, variable-reactance element 7 such as a variable-voltage capacitance element is inserted between ground conductor 20 and coplanar line portion 4A so as to connect between the left side of coplanar line portion 4A of the input side of amplifying device 1 and ground conductor 20 in that vicinity. When establishing the point for applying the control voltage to variable-reactance element 7, due consideration should be given to the resonance mode on the coplanar line. In addition, the portion of output port 6 which electromagnetically couples with the coplanar line is formed as loop-shaped microstrip line 6A.

Figure 5A:
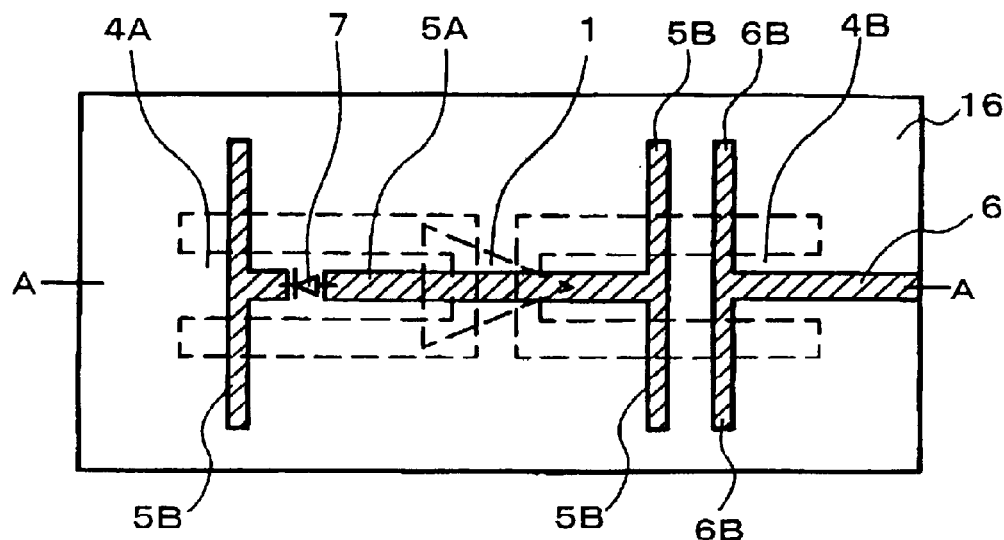
FIG. 5A is a plan view showing the high-frequency oscillator according to a fourth embodiment of the present invention.
Figure 5B:
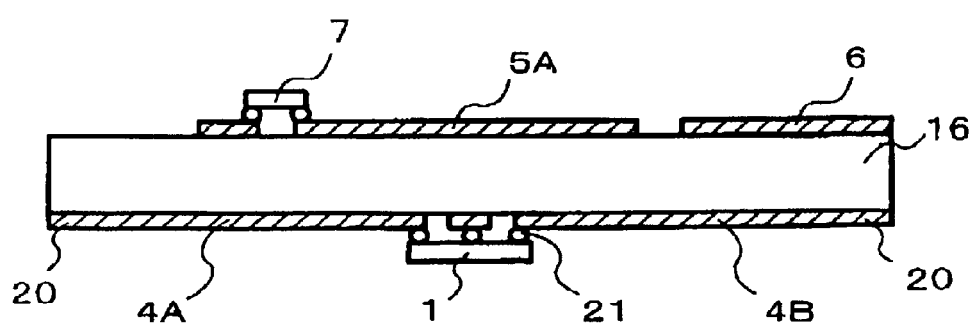
FIG. 5B is a sectional view taken along line A—A of FIG. 5A.

The high-frequency oscillator according to the fourth embodiment of the present invention shown in FIGS. 5A and 5B is the oscillator of the second embodiment in a variable-frequency form, and is constituted as a voltage-controlled oscillator. In other words, the oscillator of the fourth embodiment is an oscillator in which variable-reactance element 7 such as a variable-voltage capacitance element is serially inserted in feedback circuit 5A in the oscillator of the second embodiment. More specifically, feedback circuit 5A is cut at a position that overlies coplanar line portion 4A on the input side of amplifying device 1 and variable-reactance element 7 is mounted so as to connect this cut point. In this case, the control voltage is applied to variable-reactance element 7 by way of high-impedance resistance. Further, in the oscillator shown in the figure, output port 6 and feedback circuit 5A are not directly joined, and resonant line 6B of microstrip line structure is also connected to output port 6.

An can be clearly understood from the above-described third and fourth embodiments, the present invention enables the easy realization of variable control of oscillation frequency by means of simple circuit structure.

Figure 6A:
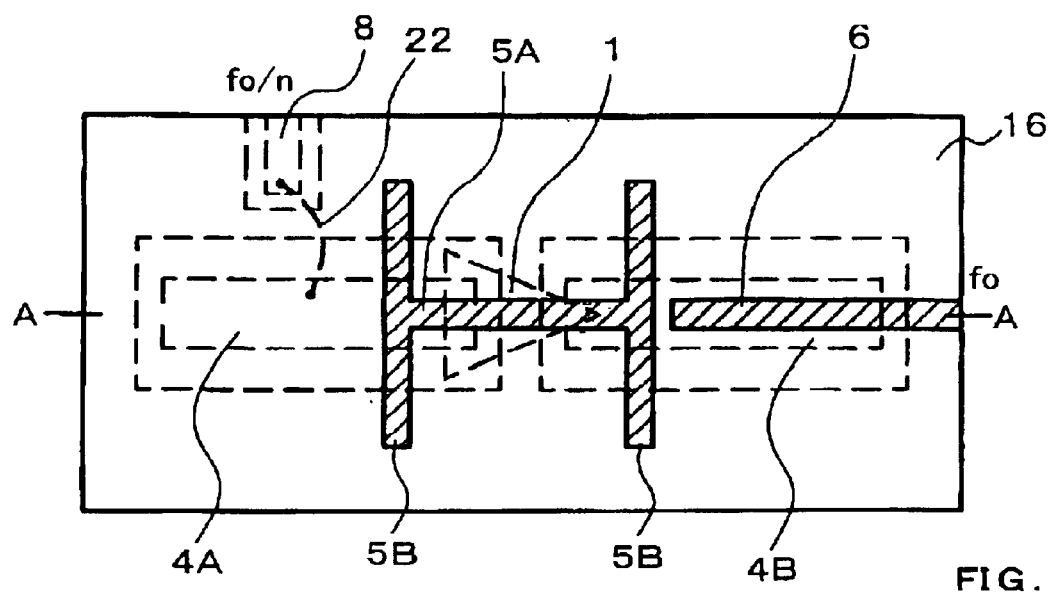
FIG. 6A is a plan view showing the high-frequency oscillator according to a fifth embodiment of the present invention.
Figure 6B:
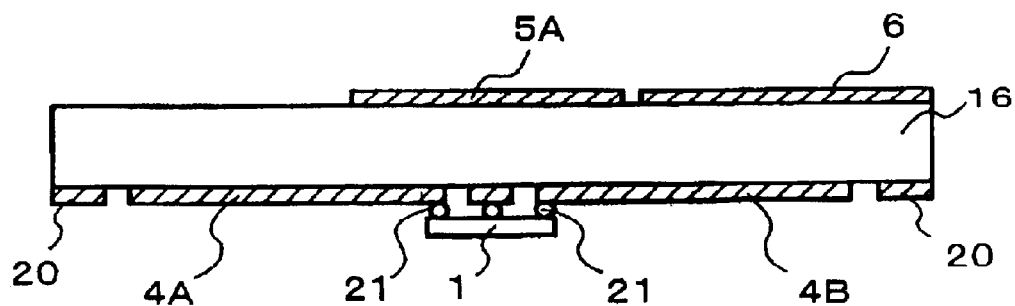
FIG. 6B is a sectional view taken along line A—A of FIG. 6A.

Referring now to FIGS. 6A and 6B, the high-frequency oscillator according to the fifth embodiment of the present invention is next described. This oscillator is a so-called subharmonic injection locking oscillator which injects a synchronizing signal having a frequency that is an integral submultiple 1/N of oscillation frequency $f_0$, where N is an integer of 2 or greater, to establish oscillation synchronization. In this case, transmission line 8 for injecting a subharmonic synchronizing signal $f_0/n$ is provided on the second principal surface of substrate 16 in the oscillator of the first embodiment, and the synchronizing signal is injected from this transmission line 8 to coplanar line portion 4A. In the oscillator shown in the figure, transmission line 8 is provided as a coplanar line, and a signal is injected by way of bonding wire 22 from the end of this transmission line 8 to coplanar line portion 4A. Here as well, a point is preferably selected for injecting the synchronizing signal at which there is little effect on the resonant mode. In addition, instead of a loop-shaped feedback circuit, feedback circuit 5A which is made up by a linear microstrip line is employed as the feedback circuit which is provided on the first principal surface, and resonant lines 5B are connected to both ends of this feedback circuit 5A.

This type of subharmonic injection locking oscillator enables an improvement of the phase noise characteristic and greater frequency stability, and through the use of this oscillator, a millimeter band frequency synthesizer can easily be realized.

Figure 7A:
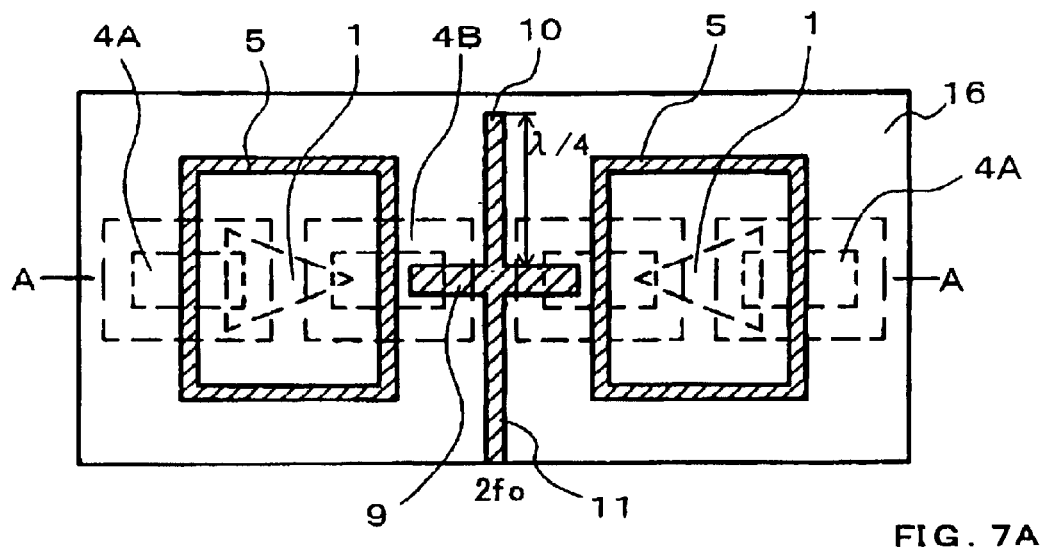
FIG. 7A is a plan view showing the high-frequency oscillator according to a sixth embodiment of the present invention.
Figure 7B:
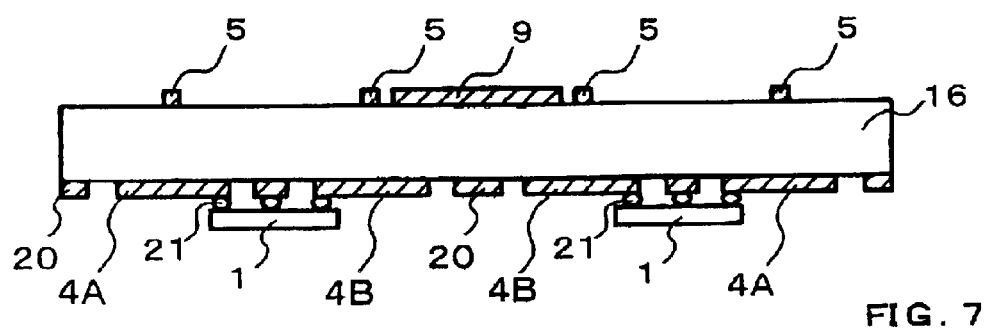
FIG. 7B is a sectional view taken along line A—A of FIG. 7A.

Through the use of two oscillator systems according to each of the above-described embodiments, a two-phase push—push oscillator can also be easily realized that effectively obtains frequency output $2f_0$ that is twice the fundamental oscillation frequency $f_0$ of these oscillators. A two-phase push—push oscillator combines the outputs from two oscillators having the same fundamental oscillation frequency $f_0$, whereby the fundamental frequency components cancel each other to obtain even-numbered order harmonics of the fundamental frequency $f_0$, in particular, the secondary harmonic component $2f_0$. The high-frequency oscillator according to the sixth embodiment shown in FIGS. 7A and 7B is an example of this type of two-phase push—push oscillator.

The oscillator of the sixth embodiment is configured to obtain doubled wave (i.e., the second order harmonic component) $2f_0$ by providing two oscillators according to the first embodiment having a fundamental oscillation frequency of $f_0$ on the same substrate 16 and then combining the oscillation output from the output ports of these oscillators. More specifically, each oscillator is arranged such that coplanar line portions 4B on the output side of each oscillator confront each other, and linear microstrip line 9 is formed on the first principal surface of substrate 16 so as to electromagnetically couple with the coplanar line portions 4B of the two oscillators. This microstrip line 9 is equivalent to the output port of each oscillator. Open-end microstrip line 10 having ¼ the length of wavelength $\lambda$ of the fundamental oscillation frequency $f_0$ and output port 11 of microstrip line structure are then both connected to the midpoint of microstrip line 9. In this push—push oscillator, open-end microstrip line 10 has an impedance of substantially zero with respect to fundamental frequency $f_0$ while the impedance with respect to doubled wave $2f_0$ is substantially infinitely great, whereby only the doubled wave component $2f_0$ is outputted from output port 11.

Thus, based on the present invention, a harmonic oscillator can easily be realized that outputs a frequency which is twice the frequency of the fundamental frequency by means of an extremely simple circuit structure.

Figure 8:
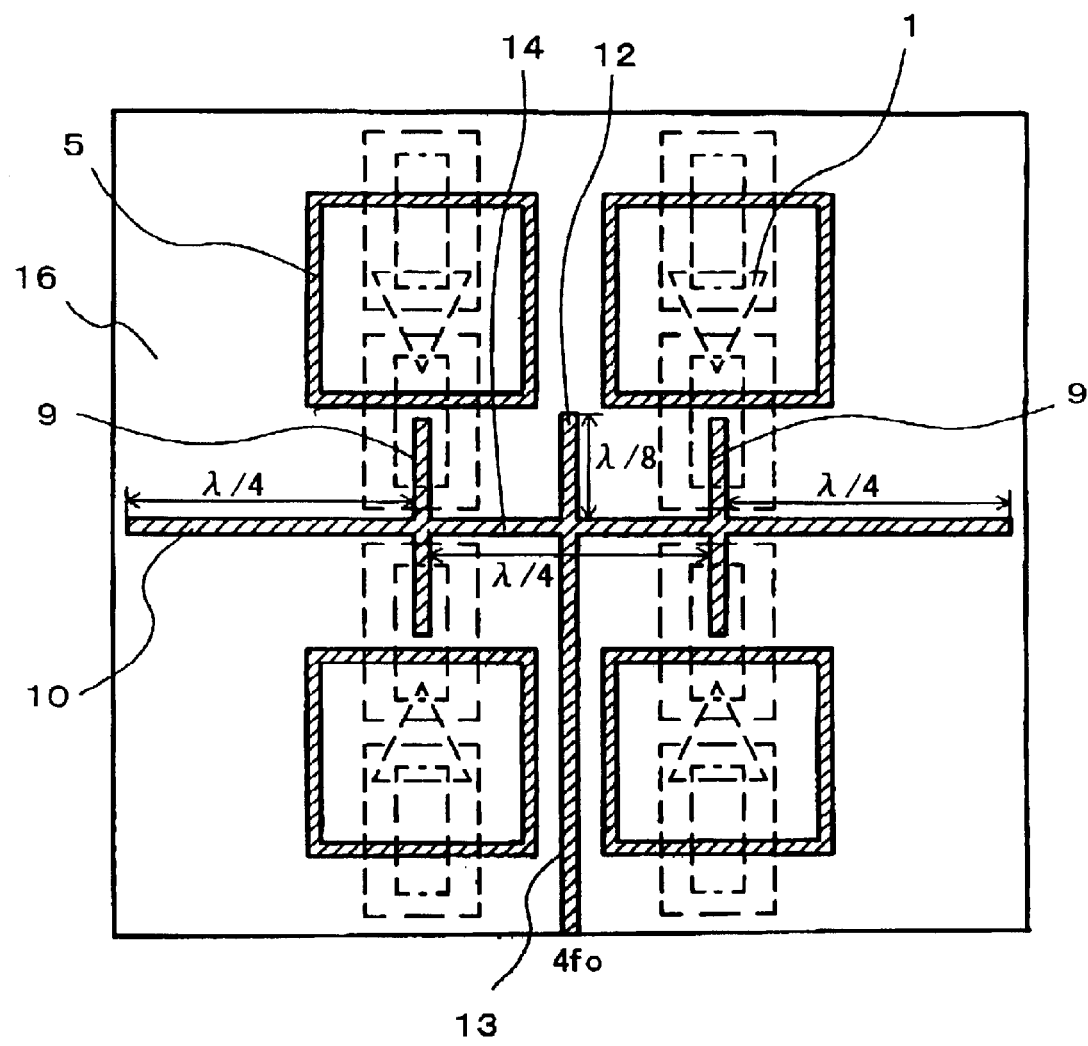
FIG. 8 is a plan view showing the high-frequency oscillator according to a seventh embodiment of the present invention.

Referring now to FIG. 8, the high-frequency oscillator according to the seventh embodiment of the present invention is next discussed. Based on the principles of the above-described push—push oscillator, the use of two sets of push—push oscillators of the sixth embodiment enables a four-phase push—push oscillator to be constituted which outputs frequency $4f_0$ which is four times the fundamental frequency $f_0$. The seventh embodiment shows this type of four-phase push—push oscillator. Here, two two-phase push—push oscillators according to the sixth embodiment are provided on the same substrate, and the output ports of these two-phase push—push oscillators are coupled together by microstrip line 14 provided on the first principal surface. With the wavelength for fundamental oscillation frequency $f_0$ being $\lambda$, open-end microstrip line 12 having a length of $\lambda/8$ and output port 13 are connected to the midpoint of microstrip line 14. In addition, the length of microstrip line 14 is set to $\lambda/4$.

In this construction, microstrip line 14 operates as a half-wave resonance circuit with respect to doubled wave $2f_0$, and the outputs of the two two-phase push—push oscillators are therefore mutually opposite phases. In addition, open-end microstrip line 12 has an impedance of substantially zero with respect to doubled wave $2f_0$, and an impedance that is substantially infinitely great with respect to quadruple wave (i.e., the fourth-order harmonic component of the fundamental frequency) $4f_0$. Thus, based on the principles of a push—push oscillator, a quadruple wave $4f_0$ is obtained as oscillation output from output port 13.

The present invention thus enables the realization of an ultra-high frequency oscillator for outputting a signal that is four times the fundamental oscillation frequency by means of an extremely simple circuit structure. This oscillator shows particular promise as a millimeter wave or sub-millimeter wave oscillator. By taking full advantage of the high degree of design freedom which is provided by a three-dimensional monolithic microwave integrated circuit, this oscillator can also be easily constituted as a monolithic circuit and can be particularly effective for realizing a millimeter band oscillator.

Figure 9A:
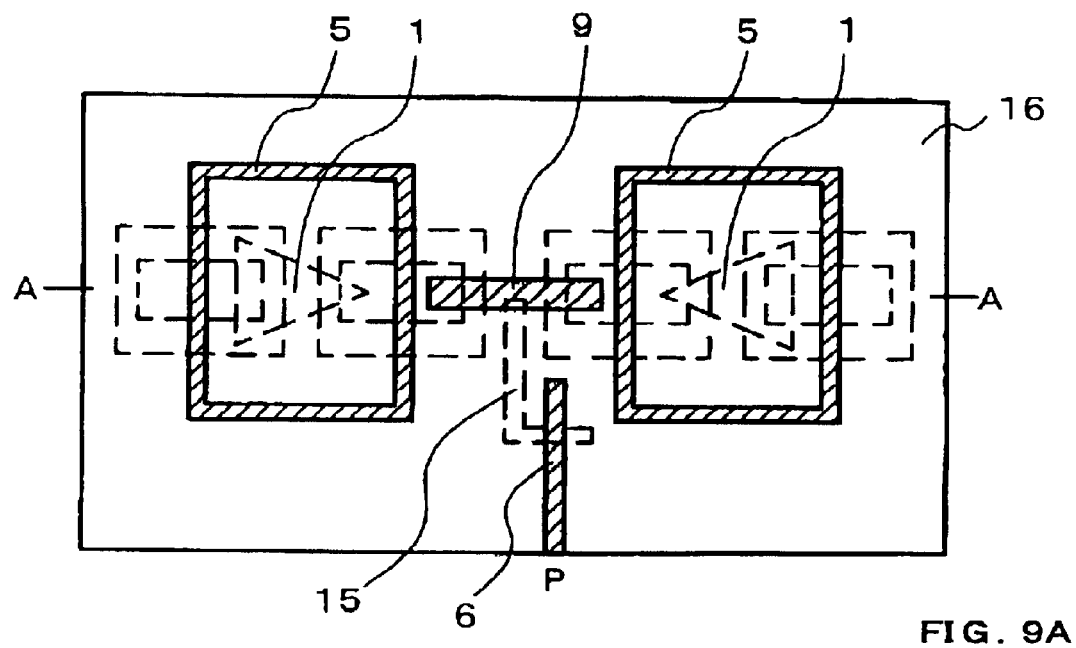
FIG. 9A is a plan view showing the high-frequency oscillator according to an eighth embodiment of the present invention.
Figure 9B:
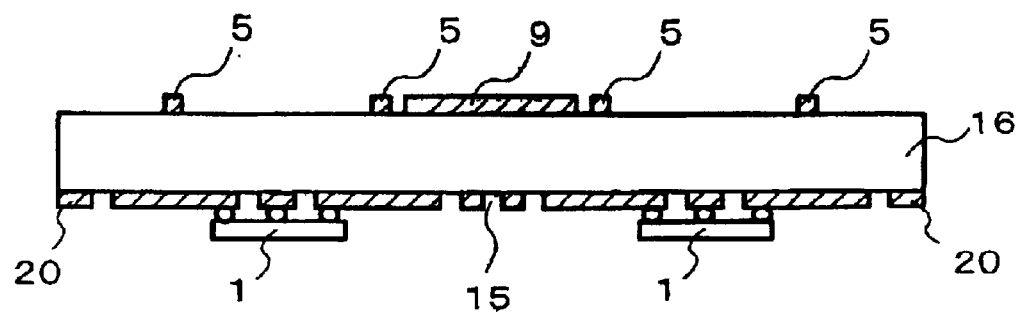
FIG. 9B is a sectional view taken along line A—A of FIG. 9A.

Referring to FIGS. 9A and 9B, the high-frequency oscillator according to the eighth embodiment of the present invention is next discussed.

In contrast to the push—push oscillator that was described in the sixth embodiment in which the antiphase outputs of two oscillators that oscillate at fundamental oscillation frequency $f_0$ were combined to obtain a doubled wave $2f_0$, a two-phase push-pull oscillator is realized in this embodiment in which the outputs of two oscillators which oscillate at fundamental oscillation frequency $f_0$ are combined in-phase to obtain oscillation output P which is substantially doubled. Here, two oscillators based on the first embodiment are formed on the same substrate 16 with each oscillator being arranged such that coplanar line portions 4B on the output-sides of the two oscillators confront each other. Linear microstrip line 9 is then formed on the first principal surface of substrate 16 so as to electromagnetically couple with coplanar line portions 4B of the two oscillators. This microstrip line 9 corresponds to the output port of each oscillator. Slotline 15 which electromagnetically couples with microstrip line 9 is then provided on the second principal surface of substrate 16, following which output port 6 of microstrip line structure is connected on the first principal surface so as to electromagnetically couple with slotline 15. The end portion of slotline is just reaches the position of the midpoint of microstrip line 9, and the conversion from microstrip line 9, which is an unbalanced line, to slotline 15, which is a balanced line, results in the in-phase combination of the outputs from each oscillator to obtain oscillation output P which is substantially twice the output obtained when using a single oscillator.

According to the present invention, a high-frequency oscillator can be easily realized by means of an extremely simple circuit structure that provides a combined output P that is substantially double the output when using a single oscillator.

What is claimed is:

1. A high-frequency oscillator, comprising:
   a substrate;
   a first transmission line of coplanar structure which is arranged on one principal surface of said substrate;
   an amplifier which has an input terminal and an output terminal, and which is inserted into said first transmission line such that said input terminal and said output terminal connect to said first transmission line; and
   a second transmission line which is provided on the other principal surface of said substrate, which electromagnetically couples with said first transmission line, and which constitutes a feedback circuit with respect to said amplifier.

2. A high-frequency oscillator according to claim 1, wherein said first transmission line is a coplanar line of finite length.

3. A high-frequency oscillator according to claim 2, wherein said coplanar line is composed of a first coplanar line portion having one end connected to said input terminal and a second coplanar line portion having one end connected to said output terminal; a portion of a ground conductor provided on said one principal surface is interposed between said first coplanar line portion and said second coplanar line portion; and said second transmission line electromagnetically couples with both of said first coplanar line portion and said second coplanar line portion.

4. A high-frequency oscillator according to claim 2, wherein said coplanar line is a transmission line in which both ends are open.

5. A high-frequency oscillator according to claim 2, wherein both ends of said coplanar line are connected to a ground conductor provided on said first principal surface.

6. A high-frequency oscillator according to claim 2, wherein a variable-reactance element is loaded on said coplanar line.

7. A high-frequency oscillator according to claim 4, further comprising a ground conductor on said first principal surface, wherein a variable-reactance element is loaded between any one of the open ends of said coplanar line and said ground conductor in vicinity of the open end.

8. A high-frequency oscillator according to claim 2, further comprising a means for injecting a subharmonic synchronizing signal to a central conductor which constitutes said coplanar line.

9. A high-frequency oscillator according to claim 1, wherein said second transmission line is a microstrip line.

10. A high-frequency oscillator according to claim 3, wherein said second transmission line is a microstrip line formed in a loop shape which straddles said first and second coplanar line portions.

11. A high-frequency oscillator according to claim 3, wherein said second transmission line is a microstrip line that is formed in a generally linear shape along said first and second coplanar line portions.

12. A high-frequency oscillator according to claim 3, further comprising, on said second principal surface, an output port having microstrip line structure which electromagnetically couples with said second coplanar line portion.

13. A high-frequency oscillator according to claim 2, wherein said second transmission line is a microstrip line.

14. A high-frequency oscillator according to claim 9, further comprising a variable-reactance element that is inserted in said second transmission line.

15. A high-frequency oscillator according to claim 1, wherein said substrate is composed of a dielectric material.

16. A two-phase push—push oscillator, comprising:
   two sets of high-frequency oscillators according to claim 1 having a same fundamental frequency and provided on the same substrate;
   a microstrip line for connecting together output ports of each of said high-frequency oscillators; and
   a means for extracting a frequency component which is twice said fundamental oscillation frequency from a midpoint of said microstrip line.

17. A four-phase push—push oscillator, comprising:
   two sets of two-phase push—push oscillators according to claim 16 having a same fundamental oscillation frequency and provided on the same substrate;
   a second microstrip line for connecting together output ports of each of said two-phase push—push oscillators; and a means for extracting a frequency component which is four times said fundamental oscillation frequency from a midpoint of said second microstrip line.

18. A two-phase push-pull oscillator, comprising:

two sets of high-frequency oscillators according to claim 1 having a same fundamental oscillation frequency and provided on the same substrate;

a microstrip line for connecting together output ports of each of said high-frequency oscillators; and a means for extracting and effecting in-phase combination of the oscillation output of each of said high-frequency oscillators from a midpoint of said microstrip line.

* * * * *

UNITED STATES PATENT AND TRADEMARK OFFICE
CERTIFICATE OF CORRECTION

PATENT NO. : 6,771,137 B2 Page 1 of 1
DATED : November 27, 2002
INVENTOR(S) : Aikawa et al.

It is certified that error appears in the above-identified patent and that said Letters Patent is hereby corrected as shown below:

<u>Title page,</u>
Item [73], Assignee, add -- Masayoshi Aikawa --

Signed and Sealed this

Fourteenth Day of December, 2004

JON W. DUDAS
*Director of the United States Patent and Trademark Office*